United States Patent
Moghadam et al.

(10) Patent No.: US 7,097,886 B2
(45) Date of Patent: *Aug. 29, 2006

(54) DEPOSITION PROCESS FOR HIGH ASPECT RATIO TRENCHES

(75) Inventors: Farhad K. Moghadam, Saratoga, CA (US); Michael S. Cox, Davenport, CA (US); Padmanabhan Krishnaraj, San Francisco, CA (US); Thanh N. Pham, San Jose, CA (US); Zhenjiang Cui, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 139 days.

This patent is subject to a terminal disclaimer.

(21) Appl. No.: 10/319,827

(22) Filed: Dec. 13, 2002

(65) Prior Publication Data

US 2004/0115898 A1   Jun. 17, 2004

(51) Int. Cl.
*H05H 1/24* (2006.01)
(52) U.S. Cl. .................. 427/569; 427/576; 427/759
(58) Field of Classification Search ................ 427/569, 427/576, 579, 255.31
See application file for complete search history.

(56) References Cited

U.S. PATENT DOCUMENTS

| | | |
|---|---|---|
| 4,690,746 A | 9/1987 | McInerney et al. |
| 4,737,379 A | 4/1988 | Hudgens et al. |
| 4,835,005 A | 5/1989 | Hirooka et al. |
| 4,890,575 A | 1/1990 | Ito et al. |
| 5,000,113 A | 3/1991 | Wang et al. |
| 5,521,126 A | 5/1996 | Okamura et al. |
| 5,645,645 A | 7/1997 | Zhang et al. |
| 5,712,185 A | 1/1998 | Tsai et al. |
| 5,719,085 A | 2/1998 | Moon et al. |
| 5,804,259 A | 9/1998 | Robles |
| 5,872,058 A | 2/1999 | Van Cleemput et al. |
| 5,910,342 A | 6/1999 | Hirooka et al. |
| 5,916,365 A | 6/1999 | Sherman |

(Continued)

FOREIGN PATENT DOCUMENTS

EP    442 490 A1    8/1991

(Continued)

OTHER PUBLICATIONS

"Atomic Layer Deposition" by Physical Inorganic Chemistry, Institute of Applied Synthetic Chemistry, downloaded from website http://www.ias.tuwien.ac.at/research/fghh/research/pic_research_ald.html on Jul. 23, 2002, no page numbers.

(Continued)

*Primary Examiner*—Bret Chen
(74) *Attorney, Agent, or Firm*—Townsend and Townsend and Crew LLP

(57) ABSTRACT

A method of depositing an insulating film over a substrate having a gap formed between two adjacent raised features. The method includes depositing one portion of the insulating film over the substrate and in the gap using a high density plasma process that has simultaneous deposition and sputtering components and depositing another portion of the insulating film over the substrate and in the gap using an atomic layer deposition process. In some embodiments the portion of the film deposited by an atomic layer deposition process is deposited over the portion of the film deposited using a high density plasma CVD technique. In other embodiments, the portion of the film deposited by a high density plasma CVD process is deposited over the portion of the film deposited using an atomic layer deposition process.

19 Claims, 6 Drawing Sheets

U.S. PATENT DOCUMENTS

| | | | |
|---|---|---|---|
| 5,976,327 | A | 11/1999 | Tanaka |
| 5,990,013 | A | 11/1999 | Berenguer et al. |
| 6,013,191 | A | 1/2000 | Nasser-Faili et al. |
| 6,013,584 | A | 1/2000 | M'Saad |
| 6,025,627 | A | 2/2000 | Forbes et al. |
| 6,030,881 | A | 2/2000 | Papasouliotis et al. |
| 6,039,851 | A | 3/2000 | Iyer |
| 6,194,038 | B1 | 2/2001 | Rossum |
| 6,200,893 | B1 | 3/2001 | Sneh |
| 6,217,658 | B1 | 4/2001 | Orczyk et al. |
| 6,228,751 | B1 | 5/2001 | Yamazaki et al. |
| 6,305,314 | B1 | 10/2001 | Sneh et al. |
| 6,313,010 | B1 | 11/2001 | Nag et al. |
| 6,342,277 | B1 | 1/2002 | Sherman |
| 6,355,561 | B1 | 3/2002 | Sandhu et al. |
| 6,395,150 | B1 * | 5/2002 | Van Cleemput et al. ............ 204/192.37 |
| 6,569,501 | B1 * | 5/2003 | Chiang et al. ............ 427/535 |
| 6,576,945 | B1 * | 6/2003 | Mandelman et al. ....... 257/301 |
| 6,596,654 | B1 | 7/2003 | Bayman et al. |
| 6,734,082 | B1 * | 5/2004 | Zheng et al. ............ 438/435 |
| 6,759,675 | B1 * | 7/2004 | Csutak et al. ............ 257/21 |
| 6,784,096 | B1 * | 8/2004 | Chen et al. ............ 438/637 |
| 6,815,226 | B1 * | 11/2004 | Lee et al. ............ 438/3 |
| 2001/0002280 | A1 | 5/2001 | Sneh |
| 2001/0028924 | A1 | 10/2001 | Sherman |
| 2001/0041250 | A1 | 11/2001 | Werkhoven et al. |
| 2002/0031618 | A1 | 3/2002 | Sherman |
| 2004/0048461 | A1 * | 3/2004 | Chen et al. ............ 438/629 |

FOREIGN PATENT DOCUMENTS

| | | |
|---|---|---|
| EP | 526 779 B1 | 2/1993 |
| GB | 2 267 291 A | 12/1993 |
| JP | 2-58836 A | 2/1990 |
| JP | 7-161703 A | 6/1995 |
| WO | WO 00/54320 A1 | 9/2000 |
| WO | WO 01/40541 A1 | 6/2001 |
| WO | WO 01/66832 A2 | 9/2001 |
| WO | WO 00/61833 A1 | 10/2001 |

OTHER PUBLICATIONS

George et al., "Atomic layer controlled deposition of $SiO_2$ and $Al_2O_3$ using ABAB . . . binary reaction sequence chemistry," *Applied Surface Science*, 82/83:460-467 (1994).

George et al., "Surface Chemistry for Atomic Layer Growth," *J. Phys. Chem.*, 100(31) 13121-13131 (1996).

Klaus et al., "Atomic Layer Deposition of $SiO_2$ Using Catalyzed and Uncatalyzed Self-Limiting Surface Reactions," *Surface Review and Letters*, 6(3/4):435-448 (1999).

Klaus et al., "Atomic layer controlled growth of $SiO_2$ films using binary reaction sequence chemistry," *Appl. Phys. Lett.*, 70(9):1092-1094 (1997).

Morishita et al., "New substances for atomic-layer deposition of silicon dioxide," *J. Non-Crystalline Solids*, 187:66-69 (1995).

Nalwa, H.S., *Handbook of Low and High Dielectric Constant Materials and Their Applications*, vol. 1, p. 66 (1999).

Nguyen, S. V., "High-Density Plasma Chemical Vapor Deposition of Silicon-Based Dielectric Films for Integrated Circuits," *Journal of Research and Development*, 43(1/2) (1999), pp. 1-17.

Vassiliev et al., "Trends in Void-Free Pre-Metal CVD Dielectrics," *Solid State Technology*, pp. 129-136 (2001).

Wise et al., "Diethyldiethoxysilane as a New Precursor for $SiO_2$ Growth on Silicon," from *Gas-Phase and SurfaceChemistry in electronic Materials Processing*, Mountziaris et al., eds., from Symposium held Nov. 29, 1993 thru Dec. 2, 1993 in Boston Massachusetts, pp. 37-43.

Yamaguchi et al., "Atomic-layer chemical-vapor-deposition of silicon dioxide films with an extremely low hydrogen content," *Applied Surface Science*, 130-132:202-207 (1998).

* cited by examiner

DEPOSITION PROCESS FOR HIGH ASPECT RATIO TRENCHES

BACKGROUND OF THE INVENTION

One of the primary steps in the fabrication of modern semiconductor devices is the formation of an insulation film on a semiconductor substrate. Such insulation films are used for a variety of purposes including, among others, separating adjacent conductive layers (e.g., an intermetal dielectric (IMD) layer separates adjacent metal lines while a premetal dielectric (PMD) layer separates metal layer one from the conductive substrate) and separating adjacent active regions of the substrate (e.g., as part of a shallow trench isolation (STI) structure).

For applications such as the deposition of IMD or PMD layers in an integrated circuit or the formation of STI structures, one important physical property of the insulation film is its ability to completely fill gaps between adjacent structures without leaving voids within the gap. This property is referred to as the film's gapfill capability. Gaps that may require filling include spaces between adjacent conductive lines, spaces formed by an etched trench or the like.

As semiconductor device geometries have decreased in size over the years, the ratio of the height of such gaps to their width, the so-called "aspect ratio," has dramatically increased. Gaps having a combination of a high aspect ratio and a small width present a challenge for semiconductor manufacturers to fill completely. In short, the challenge usually is to prevent the film from forming in a manner that closes off the gap before it is filled. Failure to fill a gap completely results in the formation of a void in the deposited layer, which may adversely affect device operation.

FIG. 1 is a simplified cross-sectional view of a partially completed integrated circuit 10 that can help illustrate the gapfill issue. Partially formed integrated circuit 10 is formed over a silicon substrate 12 that includes a plurality of shallow trench isolation structures 14. As shown in FIG. 1, integrated circuit 10 has a relatively densely packed area 16 where densely packed active devices (e.g., transistors are formed) and a relatively isolated area 18 (also referred to as an "open area") where an active device may be separated from another active device by a distance that is an order of magnitude more than the spacing between devices in the densely packed area.

A typical shallow trench isolation structure is created by first forming a thin pad oxide layer 20 over the surface of silicon substrate 12 and then form a silicon nitride layer 22 over pad oxide layer 20. The nitride and oxide layers are then patterned using standard photolithography techniques and trenches 24 are etched through the nitride/oxide stack into silicon substrate 12. Trenches 24 are then filled with an insulating material such as silicon dioxide using a deposition process that has good gapfill properties. Prior to the gapfill process, however, an initial lining layer 26, such as an in situ steam generation (ISSG) oxide or other thermal oxide layer or a silicon nitride layer, is usually formed.

In some applications trench 24 has an aspect ratio of between about 6:1 to 8:1 and the formation of a highly conformal film such as oxide liner 26 in trench 24 may increase the aspect ratio even further to, for example 10:1 or higher. Thus, the filling of trenches 24 is typically one of the most challenging gapfill applications in the formation of the integrated circuit.

One popular method of forming a gapfill insulation layer over a substrate includes using plasma-enhanced chemical vapor deposition techniques, and in particular high density plasma chemical vapor deposition (HDP-CVD) techniques. HDP-CVD deposition forms a dense plasma at a low vacuum pressure. The combination of plasma density and pressure, as well as the application of energy to bias the plasma towards the substrate during film deposition, results in a deposition process that has simultaneous deposition and sputtering components. It was initially thought that because of their simultaneous dep/etch nature, HDP-CVD processes could fill the gaps or trenches that were created in almost any application. Semiconductor manufacturers have found out, however, that there is a practical limit to the aspect ratio of gaps that HDP-CVD films are able to fill.

A variety of techniques have been developed to extend the gapfill capabilities of HDP-CVD processes. These techniques include the use of relatively light sputtering agents in addition to or instead of argon as well as various multistep HDP-CVD deposition/etch/deposition (dep/etch/dep) processes. Despite these newly developed techniques, there are some applications that could benefit from alternative deposition approaches. Accordingly, improved and/or alternative approaches are desirable to fill gaps on semiconductor substrates with films of insulating material.

BRIEF SUMMARY OF THE INVENTION

Embodiments of the present invention deposit an insulating material that can be used to fill narrow, high aspect ratio gaps formed between adjacent raised features. Embodiments of the invention employ a multi-step sequence in which a combination of a high density plasma CVD (HDP-CVD) and atomic layer deposition (ALD) techniques are used to form the gapfill insulating material. The techniques of the invention are useful for a variety of applications including, among others, the formation of premetal dielectric layers, intermetal dielectric layers and shallow trench isolation structures in integrated circuits.

According to one embodiment of the invention, a method for depositing an insulating material having multiple layers over a substrate having a gap formed between two adjacent raised features is disclosed. The method includes depositing one layer of the insulating material over the substrate and in the gap using a high density plasma process that has simultaneous deposition and sputtering components and depositing another layer of the insulating material over the substrate and in the gap using an atomic layer deposition process. In some embodiments the layer of the material deposited by an atomic layer deposition process is deposited over the layer of the material deposited using a high density plasma CVD technique. In other embodiments, the layer of material deposited by a high density plasma CVD process is deposited over the layer of material deposited using an atomic layer deposition process. In still other embodiments a third layer of insulating material is deposited over the high density plasma and atomic layer deposition layers.

According to another embodiment, a method of depositing an insulating film over a substrate having a gap formed between two adjacent raised features includes depositing a first portion of the insulating film over the substrate and into the gap using a high density plasma process that has simultaneous deposition and sputtering components. After completion of the high density plasma process, a second portion of the insulating film is deposited over the first portion and into the gap using an atomic layer deposition process. The atomic layer deposition process includes: (i) exposing the substrate to a first reactant introduced into a chamber in which the substrate is disposed such that one or more layers of the first reactant are adsorbed onto the substrate, (ii) evacuating or purging the chamber of the first reactant, (iii) exposing the substrate to a second reactant of dissociated radicals to convert the first reactant into a thin film insulating compound and (iv) repeating the exposing, evacuating/purging and exposing sequence multiple times. Next, a third portion of the insulating film is deposited over the second portion using another high density plasma process that has simultaneous deposition and sputtering components.

These and other embodiments of the invention along with many of its advantages and features are described in more detail in conjunction with the text below and attached figures.

BRIEF DESCRIPTION OF THE DRAWINGS

FIG. 5A is a simplified, cross-sectional view of an exemplary substrate processing system in which one or of the deposition processes associated which embodiments of the present invention may be carried out in;

FIG. 6 is a simplified, cross-sectional view of an exemplary substrate processing system in which one or of the deposition processes associated which embodiments of the present invention may be carried out in.

DETAILED DESCRIPTION OF THE INVENTION

Embodiments of the invention pertain to a multi-step process for depositing a multilayer dielectric material into high aspect ratio features. Embodiments of the invention permit the dielectric material to be deposited with substantially 100% gapfill for most currently envisioned small-width, high aspect ratio applications. For example, for gaps having a width of 0.10 microns substantially 100% gapfill can be achieved by embodiments of the invention for aspect ratios of 8:1 and even higher in both the active and open areas of an integrated circuit die. Embodiments of the invention are useful for a variety of different applications and are particularly useful for the fabrication of integrated circuits having minimum feature sizes of 0.10 microns or less.

Embodiments of the invention employ a combination of high density plasma CVD (HDP-CVD) and atomic layer deposition (ALD) techniques to deposit the insulating film within the gaps to be filled. In some embodiments, a first layer of the film is deposited within the gap by an atomic layer deposition process and a second layer of the film is deposited over the first portion and within the gap using a high density plasma CVD technique. In other embodiments, a first layer of the film is deposited by a high density plasma CVD process and a second layer of the film is deposited over the first portion and within the gap using atomic layer deposition techniques. In still other embodiments the insulating film includes a third layer deposited over the high density plasma and atomic layer deposition layers.

In some embodiments, the HDP-CVD and ALD processes are performed consecutively in a single chamber without transferring the substrate out of the chamber. In other embodiments the processes are performed in first and second chambers of a multichamber substrate processing system where the substrate is transferred from the first chamber to the second chamber under vacuum conditions. In still other embodiments, the process can be performed in different chambers in an ex situ process that transfers the wafers from one chamber located in one location of a fabrication facility (fab) to another chamber located in a different location at the fab.

Figure 2:
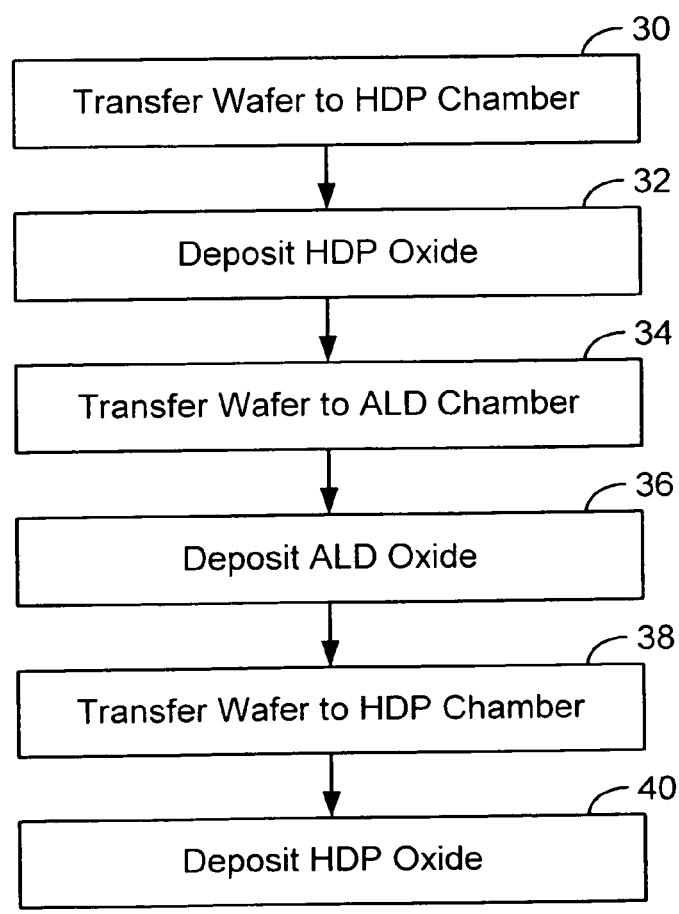
FIG. 2 is a flowchart depicting the steps associated with one embodiment of the present invention.

In order to better appreciate and understand the present invention, reference is made to FIG. 2, which is a flowchart depicting steps associated with one embodiment of the invention, and to FIGS. 3A–3D, which are simplified cross-sectional views of a substrate that illustrate the profile of film growth as the substrate is processed according to the steps depicted in FIG. 2. The process discussed below with respect to FIGS. 2 and 3A–3D is for an undoped silicate glass (USG) film that may be used, for example, in a shallow trench isolation (STI) application. It is to be understood, however, that the techniques of the present invention are applicable to other applications such as intermetal dielectric (IMD) layers and premetal dielectric (PMD) among others. Also, the techniques of the present invention are applicable to the deposition of a variety of materials, the use of which is application dependent, including phosphosilicate glass (PSG), boron-doped silicate glass (BSG), borophosphosilicate glass (BPGS), fluorine-doped silicate glass (FSG), carbon-doped silicate glass (SiOC) and silicon oxynitride (SiON) among others.

Figure 3A:
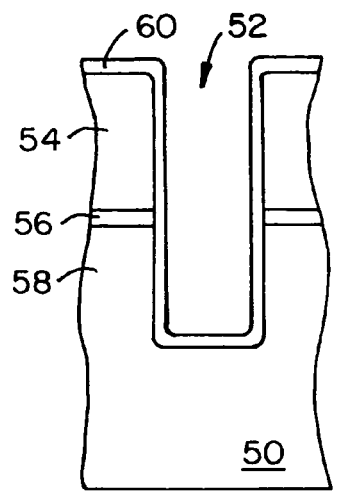
FIGS. 3A–3D are simplified cross-sectional views of a substrate that illustrate the profile of film growth as the substrate is processed according to the steps depicted in FIG. 2.

As shown in FIG. 2, the process starts by loading a substrate into a multi-chamber substrate processing system, such as a Centura™ platform manufactured by Applied Materials, assignee of the present application, and transferring the substrate to a first substrate processing chamber (step 30). Referring to FIG. 3A, the substrate 50 has one or more gaps 52 formed between adjacent raised features. The raised features may be, for example, adjacent metal lines, transistor gates or other features. In FIGS. 3A–3D, however, gaps 52 represent trenches etched into a silicon substrate, such as trenches in a shallow trench isolation (STI) structure. The etched trenches define the raised features which surround the trenches and include silicon nitride portions 54 and a silicon oxide interface or glue layer 56 between the silicon nitride portions 54 and unetched portions 58 of silicon substrate 50. Also shown in FIGS. 3A–3D is a liner layer 60, such as an in situ steam generation (ISSG) oxide or other thermal oxide layer, a silicon nitride layer or other appropriate type of conformal liner material. In some applications trench 52 has an aspect ratio of between about 6:1 to 8:1 and the formation of a highly conformal film such as liner 60 in trench 52 may increase the aspect ratio even further to, for example 10:1 or higher.

Once the substrate is properly positioned, a high density plasma is formed from a deposition gas to deposit a first layer of silica glass on the substrate using a deposition process that has simultaneous deposition and sputtering components (FIG. 2, step 32). The deposition gas includes a silicon source, such as monosilane ($SiH_4$), an oxygen source, such as molecular oxygen ($O_2$), and optionally one or more sputtering agents such as molecular hydrogen ($H_2$) or an inert gas, such as helium (He), neon (Ne) or argon or (Ar).

Figure 3B:
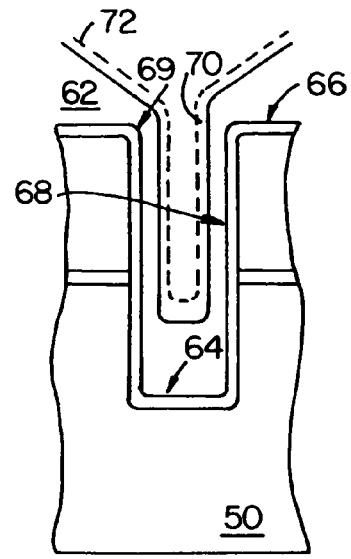

Referring to FIG. 3B, deposition of this first layer 62 results in a partial filling of gap 52. The profile of layer 62 within and outside of the gap will depend on, among other factors, the aspect ratio of the gap, the parameters used during deposition step 32 and the length of time of step 32. As is known to those of skill in the art, the deposition-to-etch ratio of the process is controlled so that the process does not undesirably etch the upper corners 69 of the gap and so that deposition within the trench proceeds in a bottom-up manner.

Generally, conventional silica glass HDP-CVD deposition techniques result in direct silicon oxide deposition on the horizontal surfaces of the substrate, such as surface 64 within gap 52 and surfaces 66 above the raised portions 54/56/58 that define the gap. The deposition process also results in indirect deposition (often referred to as re-deposition) of silicon oxide on sidewalls 68 due to the recombination of material sputtered from the silicon oxide film as it grows.

In certain small-width, high-aspect-ratio applications where the techniques of the present invention are most beneficial, even under optimal deposition-to-etch ratios, the continued growth of the silicon oxide film results in formations 70 on the upper section gap sidewall that grow toward each other at a rate of growth exceeding the rate at which the film grows laterally on lower portions of the sidewall. This growth pattern is shown by dotted line 72 in FIG. 3B which represents the growth of layer 62 if allowed to continue to an undesirable point. If deposition step 32 continues long enough, the final result of this process is a void that forms within the gap when the two opposing portions of the formations on the upper sidewall contact each other.

In some embodiments of the invention, the deposition of layer 62 is stopped prior to or just after formations 70 start to form. Generally, it is desirable to stop the deposition of layer 62 before formations 70 start to form in order to keep the entry to the gap open as wide as possible so that subsequent deposition steps can complete the gapfill process without having to fill a gap having a reentrant profile (i.e., a profile where the width of the gap at the top is narrower than the width of the gap near the bottom). It is also generally desirable to adjust the deposition-to-etch ratio of HDP-CVD deposition step 32 using techniques known to those of skill in the art so that film growth occurs more rapidly on the bottom of the trench than on the trench sidewalls. Thus, in some embodiments, when deposition of layer 62 is stopped, the height of gap 52 has been reduced by between about 25–50 percent.

The stopping point of the HDP-CVD process can be based on a timed endpoint that is determined on an application-by-application basis. Such an endpoint can be identified by, for example, running multiple deposition processes over multiple substrates having a topology similar to the topology of substrate 50, stopping each deposition process at different intervals and examining the film deposited in the trenches (e.g., by SEM photographs or other means) to determine an optimal endpoint to the deposition process.

Figure 3C:
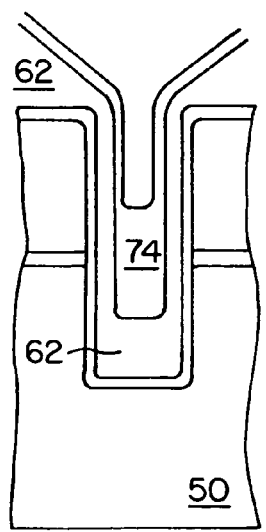

The next step of the process transfers the substrate out of the first substrate processing chamber and into a second chamber that is also part of the multi-chamber system (step 34). After the substrate is positioned in the chamber, an atomic layer deposition (ALD) process is carried out to deposit a second portion 74 of the insulation layer (step 36) as shown in FIG. 3C. During the ALD process the substrate is alternatively exposed to a flow of a silicon source, such as silane, and a plasma of oxygen radicals.

A variety of different ALD techniques can be used in step 36. In one particular embodiment during a first stage of the ALD process the substrate is exposed to a brief flow of silane (e.g., 3–10 seconds) such that less than one or up to about 10 layers of silane molecules are adsorbed on the surface of substrate. Next, the silane flow is stopped in preparation for a second stage of the process in which the substrate is exposed to a flow of dissociated oxygen radicals.

Figure 4A:
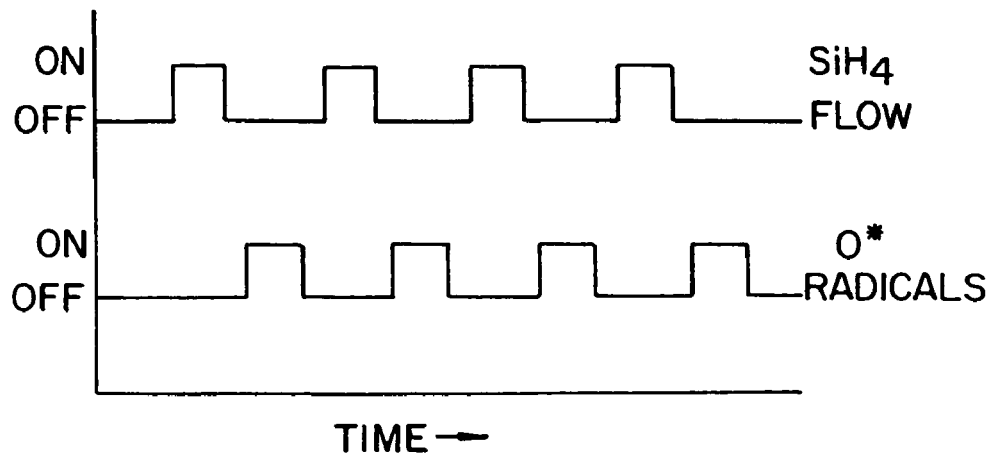
FIGS. 4A and 4B are graphs depicting gas flow sequences employed during the ALD process set forth in FIG. 2 according to two different embodiments of the invention.

During the second stage of the ALD process, the oxygen radicals react with the adsorbed silane to convert the silane molecules into a thin layer of silica glass. Byproducts from the reaction (e.g., $H_2O$ vapor) are pumped out of the chamber along with unreacted oxygen radicals. Some embodiments of the invention add a flow of a carrier gas, such as helium or argon, to the oxygen flow in order to better control the reaction between the oxygen radicals and silane molecules and/or dilute the oxygen. After the adsorbed silane molecules are converted to silicon oxide, the sequence of alternating flows of silane and oxygen radicals is then repeated multiple times until the silica glass layer reaches a desired thickness as shown in FIG. 4A.

Some embodiments of the invention bias the oxygen radicals toward the substrate during the second stage in order to promote a sputter effect from the oxygen radicals simultaneous with the conversion of the silane molecules to silicon oxide. Such a bias can be provided, for example, by applying RF energy to a pedestal or other component that holds the substrate in the chamber. Generating sputtering simultaneous with oxide growth enables the ALD process to grow more oxide layer 74 in a bottom-up manner so that the growth of the layer proceeds faster on horizontal surfaces such as the bottom 64 of trench 52 than on vertical surfaces such as trench sidewall 68 as is shown in FIG. 3C.

Also, some embodiments of the invention heat the substrate to a temperature above 300° C. during the ALD process while other embodiments of the invention heat the substrate to a temperature between about 300–800° C. during step 36. The inventors have found that at such increased temperatures multiple layers of silane molecules are adsorbed onto the surface of the substrate during the first stage of the ALD process which can then be converted to multiple layers of silicon oxide during the second stage. This allows the ALD process to proceed at a considerably higher deposition rate than single layer ALD processes.

Figure 4B:
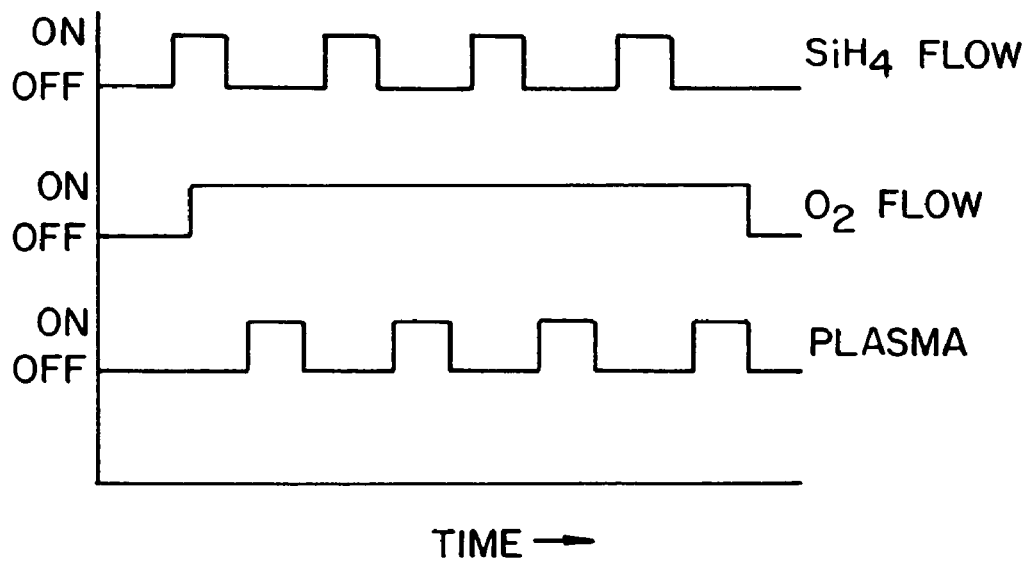

Some embodiments of the invention evacuate the ALD chamber between stages 1 and 2 of the process by stopping the flow of all gases into the chamber and pumping out residual silane molecules that are not adsorbed onto the wafer surface with a vacuum pump. Other embodiments purge residual silane out of the chamber between stages 1 and 2 by flowing a gas that is chemically inert to the silica glass forming reactants used in the first and second stages. Similarly, some embodiments evacuate or purge the chamber of residual oxygen after stage 2 in preparation for a new stage 1 in the next ALD cycle. In still additional embodiments, a flow of oxygen is maintained continuously during both the first and second stages of the ALD process. In these embodiments, chamber conditions are kept such that the combination of silane and oxygen in the first stage do not react in the gas phase to produce an oxide film. Instead, the silane flow is alternated with the application of energy to form reactive radicals from the oxygen flow as shown in FIG. 4B. During the stage where silane and oxygen are flowed into the chamber without the dissociation of the gases, silane molecules are adsorbed onto the surface of the layer. Then, when silane flow is stopped the oxygen flow purges residual silane from the chamber. Afterwards, reactive oxygen radicals are formed from the flow of oxygen and the oxygen radicals convert the absorbed silane molecules to silicon oxide.

Figure 1:
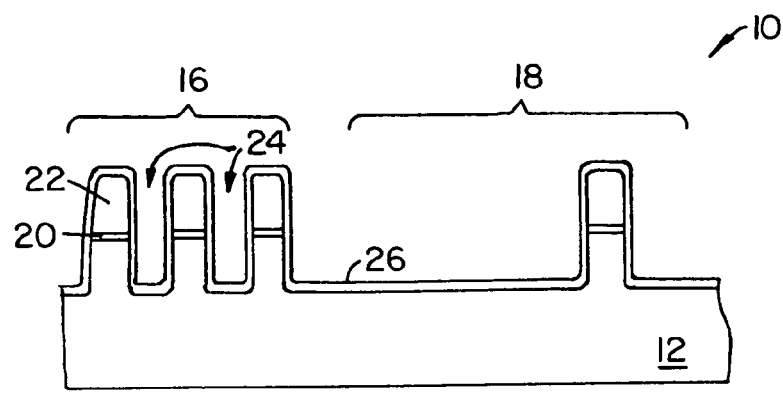
FIG. 1 is a simplified cross-sectional view of a partially completed integrated circuit that includes a plurality of shallow trench isolation structures.
Figure 3D:
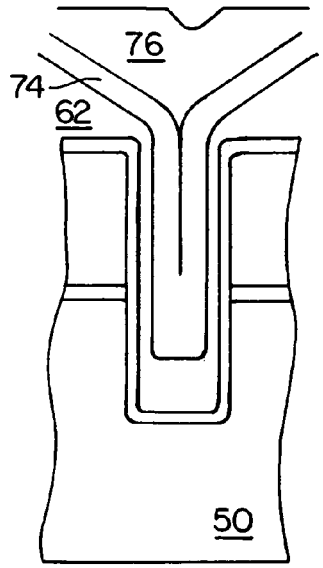

As shown in FIG. 3D, in some embodiments ALD step 36 is used to complete the gapfill process for gaps in relatively dense areas 16 (see FIG. 1) and step 36 is thus stopped shortly after the gaps in dense areas are filled. In some of these embodiments, however, the ALD process often does not completely fill the gaps in isolated areas 18 (see FIG. 1) by the time the gaps in areas 16 are filled. In such embodiments, after completion of the ALD process at step 36, the substrate is transferred out of the second chamber back into the first chamber or into a different chamber (step 38) to deposit an HDP-CVD oxide layer 76 (FIG. 3D) over the ALD layer (step 40).

In some embodiments layer 76 is deposited using substantially the same process as layer 62 in step 32. In other embodiments, however, deposition parameters for layer 76 are adjusted to optimize the deposition-to-etch ratio (dep/etch ratio) for the aspect ratio of the remaining portion of trench 52. In some embodiments the dep/etch ratio is between about 10–25:1 in each steps 32 and 40. When the deposition of layer 76 is completed, the substrate is transferred out of the HDP-CVD chamber and out of the multi-chamber substrate processing system to the next stage of processing.

Figure 3E:
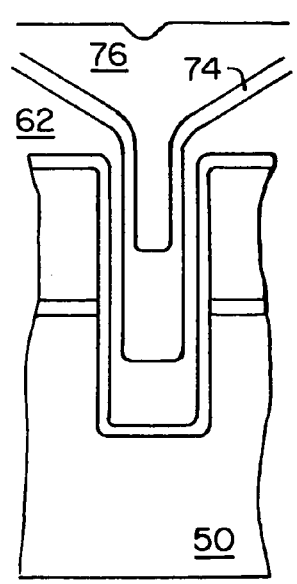

As shown in FIG. 3E, in some embodiments, ALD step 36 is stopped at a point where it has partially completed filling the gaps in both dense areas 16 and isolated areas 18. This may be done, for example, in embodiments where energy is applied during the ALD process to promote a sputtering effect by biasing the dissociated radicals towards the substrate. ALD layer 74 is often grown in a bottom-up manner in these embodiments thereby reducing the aspect ratio of the gap that is filled in a final HDP-CVD deposition step (step 40) in which HDP layer 76 is formed over ALD layer 74 and within the remaining gap.

HDP-CVD processes generally have a higher deposition rate than ALD processes, thus this three step procedure allows very high aspect ratio gaps to be filled (e.g., gaps that could not be filled effectively with a single step HDP-CVD process) in a relatively efficient manner. In some embodiment the aspect ratio of the final gap that needs to be filled in step 40 is similar to or less than the aspect ratio of the gap prior to the deposition of layer 62. Also, in some embodiments, the combination of HDP-CVD step 32 and ALD step 36 fills between 50–80 percent of gaps 52 (as measured from the bottom of the gap).

In some embodiments of the invention the HDP silicon oxide layer and ALD oxide layer are of similar quality and thus have similar wet etch rates. This feature is beneficial where the gapfill insulation film is subsequently subjected to a CMP operation that will planarize the layer by removing areas of both HDP oxide growth and ALD oxide growth. Since the layers are approximately the same density, they will exhibit similar polish rates. In some embodiments the HDP oxide has a wet etch rate ratio (WERR) of between 1.1 and 1.5 times that of thermal oxide in a buffered oxide etch solution (HF) while the ALD oxide has a WERR of between 1.3 and 1.5 times that of thermal oxide.

Embodiments of the invention can be implemented using a variety of substrate processing chambers. As previously mentioned, some embodiments perform both the HDP-CVD and ALD processes in a single chamber in an in situ process. Other embodiments employ separate HDP-CVD and ALD chambers. Suitable HDP-CVD chambers include, among others, chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below. An example of an ALD chamber in which embodiments of the invention can be employed is also set forth below.

Figure 5A:
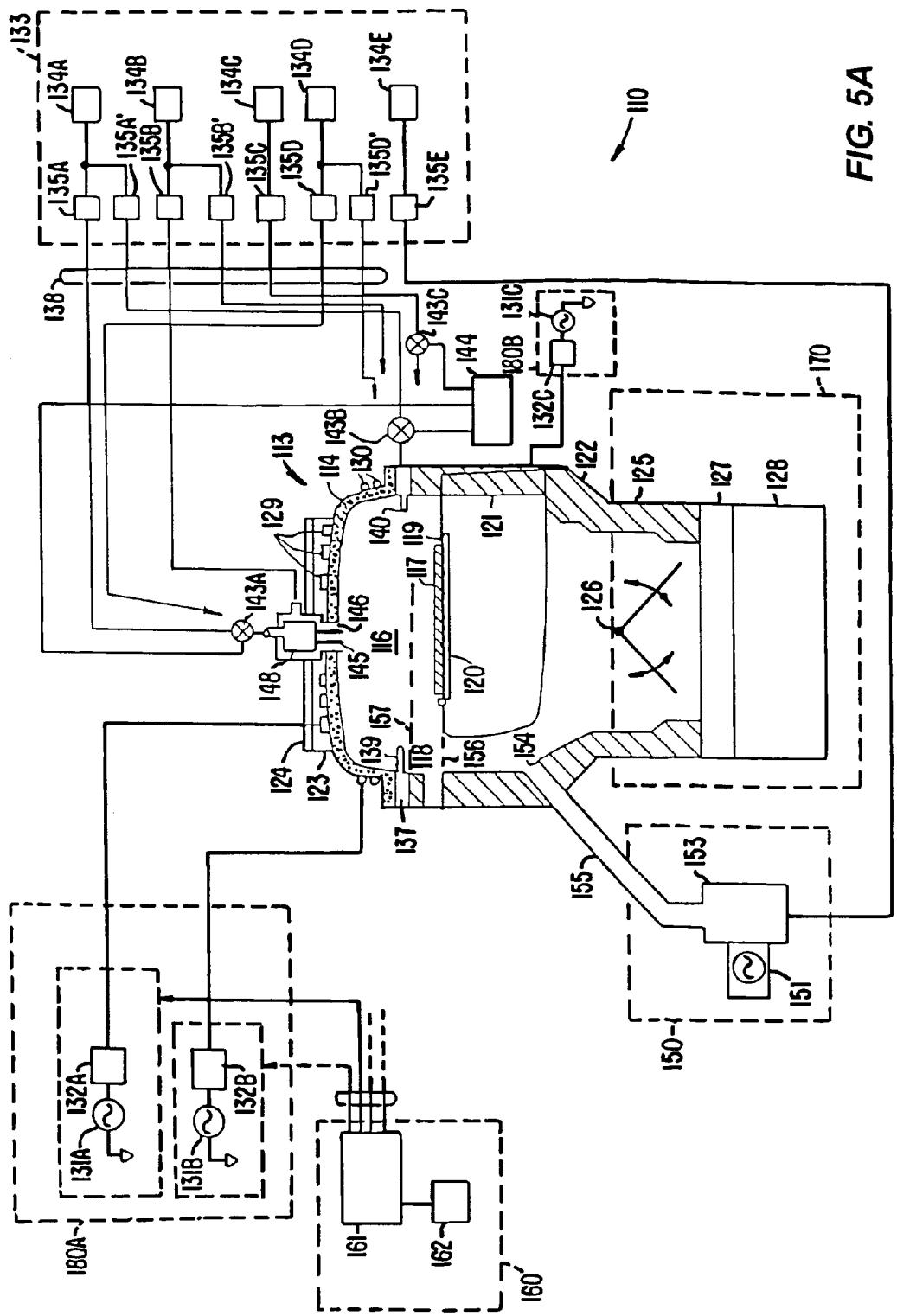

Exemplary HDP-CVD System:

FIG. 5A illustrates one embodiment of a high density plasma chemical vapor deposition (HDP-CVD) chamber 110 in which a gapfill dielectric layer according to the present invention can be deposited. HDP-CVD chamber 110 includes a housing 113 (also referred to herein as a "chamber") enclosing a substrate processing region, a substrate support 118, a gas delivery system 133, a remote plasma cleaning system 150, a vacuum system 170, a source plasma system 180A, a bias plasma system 180B.

Chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support 118, which is also made from an aluminum oxide or aluminum ceramic material.

A heater plate 123 and a cold plate 124 surmount, and are thermally coupled to, dome 114. Heater plate 123 and cold plate 124 allow control of the dome temperature to within about ±10° C. over a range of about 100C to 200° C. Generally, exposure to the plasma heats a substrate positioned on substrate support 118. Substrate support 118 includes inner and outer passages (not shown) that can deliver a heat transfer gas (sometimes referred to as a backside cooling gas) to the backside of the substrate.

Chamber 113 also includes a lower body member 122, which joins the chamber to the vacuum system. A base portion 121 of substrate support 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support 118. Substrate receiving portion 119 includes an electrostatic chuck 120 that can be used to secure the substrate to substrate support 118 during substrate processing.

Vacuum system 170 includes throttle body 125, which houses twin-blade throttle valve 126 and is attached to gate valve 127 and turbo-molecular pump 128. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures as low as about 1 mTorr.

Source plasma system 180A is coupled to a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 180B includes a bias RF (BRF) generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias_RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 133 provides gases from several sources 134(a) . . . 134(n) via gas delivery lines 138 (only some of which are shown). In the particular example illustrated below, gas sources 134(a) . . . 134(n) include separate sources for $SiH_4$, $O_2$, Ar and $NF_3$ as well as one or more sources for the extended cleaning process. As would be understood by a person of skill in the art, the actual sources used for sources 134(a) . . . 134(n) and the actual connection of delivery lines 138 to chamber 113 varies depending on the deposition and cleaning processes executed within chamber 113. Gas flow from each source 134(a) . . . 134(n) is controlled by one or more mass flow controllers (not shown) as is known to those of skill in the art.

Figure 5B:
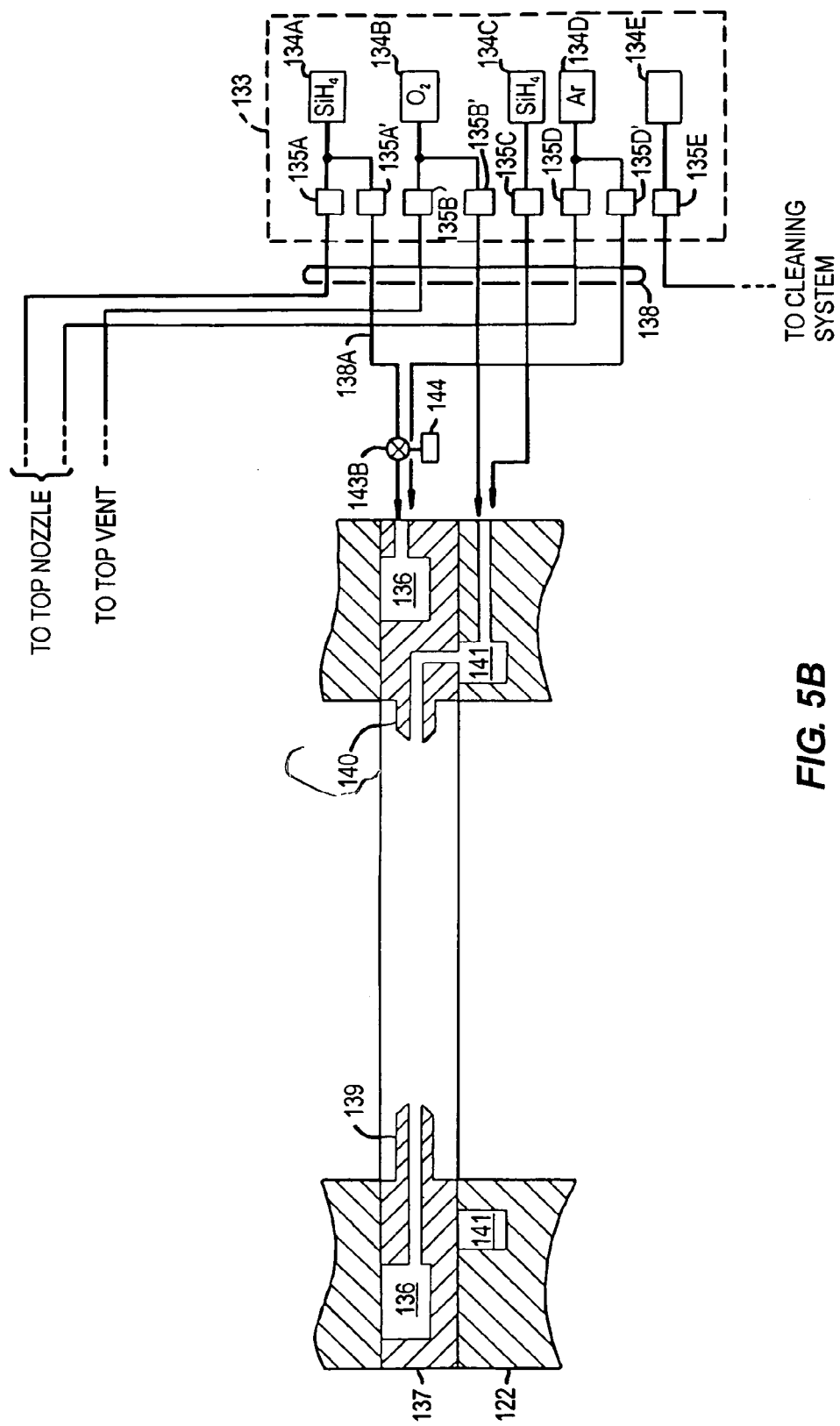
FIG. 5B is a simplified cross-sectional view of a gas ring that may be used in conjunction with the exemplary CVD processing chamber of FIG. 3A.

Gases are introduced into chamber 113 through a gas ring 137 and/or a top nozzle 145. FIG. 5B is a simplified, partial cross-sectional view of chamber 113 showing additional details of gas ring 137. In some embodiments, one or more gas sources provide gas to ring plenum 136 in gas ring 137 via gas delivery lines 138 (only some of which are shown). Gas ring 137 has a plurality of gas nozzles 139 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one specific embodiment, gas ring 137 has 124 gas nozzles 139 made from an aluminum oxide ceramic.

Gas ring 137 also has a plurality of gas nozzles 140 (only one of which is shown), which in a specific embodiment are co-planar with and shorter than source gas nozzles 139, and in one embodiment receive gas from body plenum 141. Gas nozzles 139 and 140 are not fluidly coupled in some embodiments where it is desirable to not mix gases (e.g., $SiH_4$ and $O_2$) introduced through gas ring 137 before injecting the gases into chamber 113. In other embodiments, gases may be mixed prior to injecting the gases into chamber 113 by providing apertures (not shown) between body plenum 141 and gas ring plenum 136. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 143B, to isolate chamber 113 from a delivery line 138 and to vent delivery line 138 to vacuum foreline 144, for example. As shown in FIG. 5A, other similar valves, such as 143A and 143C, may be incorporated on other gas delivery lines. Such 3-way valves may be placed as close to chamber 113 and remote plasma source 150 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 5A, chamber 113 also has top nozzle 145 and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, one source, e.g., $SiH_4$, supplies source gas nozzles 139 and top nozzle 145 through separate MFCs (not shown). Similarly, separate MFCs may be used to control the flow of oxygen to both top vent 146 and gas nozzles 140 from a single source of oxygen. The gases supplied to top nozzle 145 and top vent 146 may be kept separate prior to flowing the gases into chamber 113, or the gases may be mixed in top plenum 148 before they flow into chamber 113. In other embodiments, separate sources of the same gas may be used to supply various portions of the chamber.

A remote plasma cleaning system 150, such as a microwave plasma source or toroidal plasma source, is provided to periodically clean deposition residues from chamber components in a dry cleaning operation. The cleaning system includes a remote plasma generator 151 that creates a plasma from one or more cleaning gas source in sources 134(a). 134(n) (e.g., molecular fluorine, nitrogen trifluoride, other fluorocarbons or equivalents alone or in combination with another gas such as Argon) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

Figure 6:
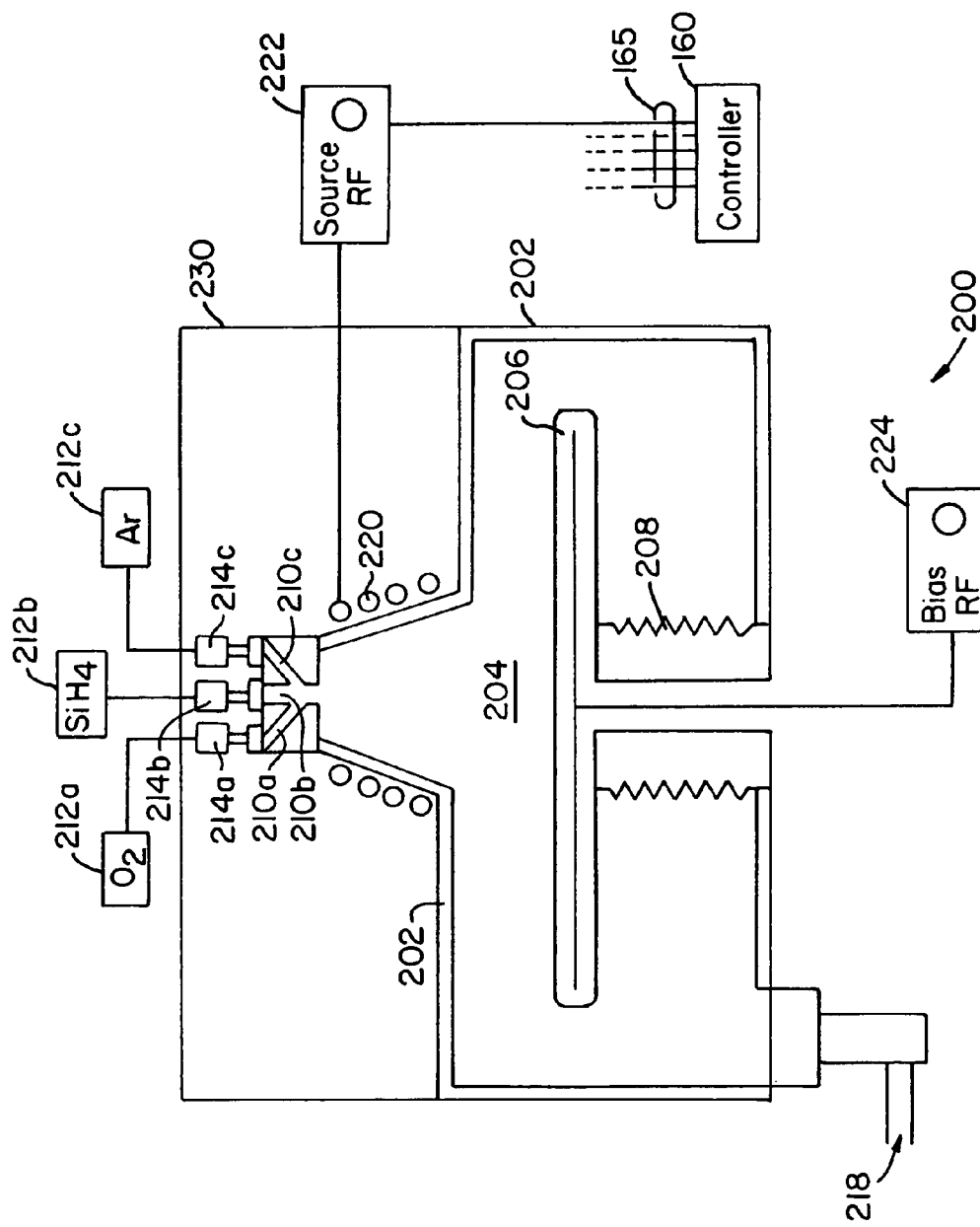

Exemplary ALD System:

FIG. 6 is a simplified cross-sectional view of one embodiment of an exemplary chamber 200 that can be used to perform the atomic layer deposition step in accordance with the present invention. Chamber 200 includes a primary chamber wall 202 that encloses a process area 204. A substrate pedestal 206 supports a substrate (not shown) within processing area 204 during ALD processing. Pedestal 206 can be raised and lowered within area 204 to a desired substrate processing position and bellows 208 prevent process gases from contacting the bottom portion of the pedestal.

Gases, such as $O_2$, $SiH_4$ and Ar (or another purge gas, diluent gas or sputtering agent) are introduced into processing area 204 through gas distribution channels 210a, 210b and 210c, respectively, from gaseous sources 212a, 212b and 212c, respectively. Switches 214a, 214b and 214c enable the pulse-like flow of gases into area 204 employed by ALD operations. In some embodiments of the invention, switches 214a–c are electrically or pneumatically operated. Gases introduced into area 204 from gas distribution channels 210a–c flow radially across the surface of the substrate positioned on substrate support 206 and out through the foreline 218 under the control of a vacuum pump (not shown). Also not shown are flow rate controllers coupled between each gas source and switch 214a–c that control the flow rate of the gases to the switch.

A narrow, upper portion of area 204 is surrounded by a coil 220. RF energy from RF power source 222 can be applied to coil 220 to form a plasma from gases introduced into this region of area 204. Dissociated species from the plasma are pumped along with the flow of gases through the chamber across the surface of the substrate. RF energy can also be applied to an electrode 226 within pedestal 206 from a bias RF power source 224 in order to promote a sputtering effect during selected stages of the ALD process. An RF shield 230 (e.g., grounded sheet metal) surrounds the upper portion of chamber 200 and coil 220.

In other embodiments, the ALD chamber may include a capacitively-coupled plasma system or other type of plasma formation system. Also, in other embodiments more or fewer gas sources 212a–c may be employed with each source having a corresponding MFC, switch and gas channel.

A system controller 160 (shown in FIGS. 5A and 6) controls the operation of both chamber 113 and chamber 200 as well as other aspects of the multichamber system (e.g., a cluster tool) the chambers are coupled to via connections to control lines 165 (which are only partially shown). Controller 160 controls, among other things, gas flow rates, RF power levels, gas pulses, pedestal spacing, chamber temperature and chamber pressure. Controller 160 may include, for example, a memory 162, such as a hard disk drive and/or a floppy disk drive and a card rack coupled to a processor 161. The card rack may contain a single-board computer (SBC), analog and digital input/output boards, interface boards and stepper motor controller boards. System controller 160 operates under the control of a computer program stored on the hard disk drive or through other computer programs, such as programs stored on a removable disk. The computer program dictates, for example, the timing, mixture of gases, RF power levels and other parameters of a particular process carried out in each chamber.

Table 1 below lists the process parameters that can be used in HDP-CVD silica glass deposition steps 32 and 40 according to one exemplary embodiment of the present invention implemented in the Ultima HDP-CVD chamber manufactured for Applied Materials and outfitted for 200 mm substrates.

TABLE 1

EXEMPLARY RANGES FOR HDP-CVD PROCESS PARAMETERS

| Parameter | Value |
| --- | --- |
| Top RF Power (1.8 MHz) | 3000–5100 W |
| Side RF Power (2.1 MHz) | 3000–4800 W |
| Bias RF Power (13.56 MHz) | 600–4000 W |
| $SiH_4$ Flow | 20-160 sccm |
| $O_2$ Flow | (1.4–2.2) × $SiH_4$ Flow |
| Ar Flow | 0–160 sccm |
| Pressure | 1.5–6.0 mTorr |

Table 2 below lists the process parameters that can be used in ALD silica glass deposition step 36 (one cycle) according to one exemplary embodiment of the present invention. In the table, stage 1 is the first portion of the ALD cycle where silane is adsorbed on the surface of the substrate and stage 2 is the later part of the ALD cycle where the adsorbed silane is converted to silica glass. Additional steps can be included in the ALD cycle to add a dopant gas and/or to evacuate or purge the chamber of selected gases between the various ALD stages. As mentioned above, ALD step 36 includes repeating the various stages of the process multiple times in order to form a film having a desired thickness.

TABLE 2

EXEMPLARY RANGES FOR ALD PROCESS PARAMETERS

| Parameter | Stage 1 Value | Stage 2 Value |
| --- | --- | --- |
| RF Power | — | 10–1000 W |
| Bias Power | — | 10–1000 W |
| Pressure | 60–100 mTorr | 2–100 mTorr |
| Temperature | 25–800° C. | 25–800° C. |
| $SiH_4$ | 10–100 sccm | — |
| $O_2$ | 0–100 sccm | 10–100 sccm |
| Ar | 0–100 sccm | 0–100 sccm |

In some embodiments a single cycle of the ALD process includes (i) flowing silane long enough in order to form less than 1 and up to 10 monolayers of silane on the surface of the substrate and then (ii) introducing oxygen radicals for between one to ten times the length of the silane flow in order to fully oxidize the surface of the substrate and form between about 2–30 Å of oxide. It is desirable to fully oxidize the substrate surface so that silicon-rich striations are not formed within the gapfill material. It is also desirable, however, to stop the flow of reactive oxygen as soon as complete oxidation occurs in order to improve throughput of the process and save costs associated with excess gas. To this end, some embodiments of the invention employ an in situ monitor, such as an interferometer, in order to determine when full oxidation has occurred. The interferometer detects radiation reflected from the surface of the substrate and compares interference patterns to previous patterns that represent a fully oxidized film for the particular application. When it is determined full oxidation has occurred, the interferometer sends a signal that can be used to endpoint the second stage of the ALD process and initiate the next ALD cycle.

The gas flow rates and RF values recited and described above are optimized for deposition processes executed in the exemplary chambers also described herein outfitted for 200 mm wafers. A person of ordinary skill in the art will recognize that these parameters and others are in part chamber specific and will vary if chambers of other design and or volume are employed.

Having fully described several embodiments of the present invention, many other equivalents or alternative embodiments of the present invention will be apparent to those skilled in the art. For example, while the invention described with respect to an undoped silicate glass layer, the invention can also be used to fill gaps with a variety of different insulating materials including, among others, of phosphosilicate glass (PSG), boron-doped silicate glass (BSG), borophosphosilicate glass (BPGS) and fluorine-doped silica glass (FSG) by adding an appropriate dopant gas such as $PH_3$ for PSG, $B_2H_6$ for BSG, $PH_3$ and $B_2H_6$ for BPSG or $SiF_4$ for FSG in the HPD-CVD deposition process gas and/or in one of the ALD cycles. Also, in other embodiments, an oxygen source such as $N_2O$ or $CO_2$ can be used instead of $O_2$ and a silicon source other than monosilane may be used. Examples of suitable silicon sources include other silane family members such as, $Si_2H_6$, $Si_3H_8$, etc.; TEOS, $SiCl_4$ or $SiF_4$ among others.

In still other embodiments, the sequence of an HDP-CVD deposition step followed by an ALD step can be repeated multiple times as desired to fill gaps in certain applications. Also, while the invention was discussed in FIG. 2 as starting with an HDP-CVD oxide deposition step, in some embodiments the gapfill process is started with an ALD deposition step and ends with a subsequent HDP-CVD deposition step. As such, the above description is illustrative and not restrictive. These equivalents and/or alternatives are intended to be included within the scope of the present invention.

What is claimed is:

1. A method of depositing an insulating film over a substrate having a gap formed between two adjacent raised features, the method comprising:
   depositing a first portion of the insulating film over the substrate and in the gap using a high density plasma process that has simultaneous deposition and sputtering components; and
   depositing a second portion of the insulating film over the substrate and in the gap using an atomic layer deposition process.

2. The method of claim 1 wherein the first portion is deposited over the second portion.

3. The method of claim 1 wherein the second portion is deposited over the first portion.

4. The method of claim 3 further comprising, after depositing the second portion of the insulating film, depositing a third portion of the insulating film using a high density plasma process that has simultaneous deposition and sputtering components.

5. The method of claim 1 wherein the first and second portions of the insulating film completely fill the gap between the two adjacent raised features.

6. The method of claim 1 wherein the atomic layer deposition process includes (i) exposing the substrate to a first reactant introduced into a chamber in which the substrate is disposed such that one or more layers of the first reactant are adsorbed onto the substrate, (ii) purging or evacuating the chamber of the first reactant and (iii) exposing the substrate to a second reactant to convert the first reactant into a thin film insulating compound.

7. The method of claim 6 wherein the second reactant comprises a gaseous mixture of dissociated radicals.

8. The method of claim 7 wherein the insulating layer is a silica glass film.

9. The method of claim 8 wherein the first and second film portions are deposited in the same chamber.

10. The method of claim 8 wherein the first and second film portions are deposited in first and second chambers respectfully that are part of the same multichamber tool so that the substrate can be transferred under vacuum conditions from the first chamber to the second chamber.

11. The method of claim 1 wherein the second portion of the film is formed by repeating the exposing, evacuating/purging and exposing sequence multiple times.

12. A method of depositing an insulating film over a substrate having a gap formed between two adjacent raised features, the method comprising:
   depositing a first portion of the insulating film over the substrate and in the gap using a high density plasma process that has simultaneous deposition and sputtering components;
   thereafter, stopping the high density plasma process and depositing a second portion of the insulating film over the first portion and in the gap using an atomic layer deposition process by (i) exposing the substrate to a first reactant introduced into a chamber in which the substrate is disposed such that one or more layers of the first reactant are adsorbed onto the substrate, (ii) purging or evacuating the chamber of the first reactant, (iii) exposing the substrate to a second reactant of dissociated radicals to convert the first reactant into a thin film insulating compound and (iv) repeating the exposing, purging/evacuating and exposing sequence multiple times;
   thereafter, depositing a third portion of the insulating film over the second portion using a high density plasma process that has simultaneous deposition and sputtering components.

13. The method of claim 12 wherein the insulating layer is a silica glass film.

14. The method of claim 13 wherein the silica glass film is either a undoped silica glass (USG) film, a phosphorus-doped silica glass (PSG) film or a borophosphosilica glass (BPSG) film.

15. The method of claim 13 wherein the high density plasma processes that is used to deposit the first portion of the film forms a plasma from a process gas comprising silane ($SiH_4$), an oxygen source and a light weight sputtering agent that comprises molecular hydrogen and/or helium.

16. The method of claim 15 wherein the first reactant in the atomic layer deposition process comprises silane ($SiH_4$) and the second reactant is formed by generating a plasma from an oxygen source.

17. The method of claim 16 wherein the oxygen source is flowed into the chamber along with the first reactant.

18. The method of claim 15 wherein the first and second film portions are deposited in the same chamber.

19. The method of claim 15 wherein the first and second film portions are deposited in first and second chambers respectfully that are part of the same multichamber tool so that the substrate can be transferred under vacuum conditions from the first chamber to the second chamber.

* * * * *